(12) United States Patent
Morita

(10) Patent No.: US 7,556,501 B2
(45) Date of Patent: Jul. 7, 2009

(54) STANDING BOARD FIXING STRUCTURE AND TELEVISION RECEIVING APPARATUS

(75) Inventor: Shinji Morita, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 12/081,198

(22) Filed: Apr. 11, 2008

(65) Prior Publication Data
US 2008/0298888 A1    Dec. 4, 2008

(30) Foreign Application Priority Data
Apr. 12, 2007   (JP) ............................. 2007-104379

(51) Int. Cl.
*H01R 12/00* (2006.01)
(52) U.S. Cl. .......................... 439/62; 439/630; 361/759
(58) Field of Classification Search .................. 439/62, 439/552, 555, 630; 361/759, 801, 807
See application file for complete search history.

(56) References Cited

U.S. PATENT DOCUMENTS

| | | | | |
|---|---|---|---|---|
| 4,579,406 A | * | 4/1986 | Laursen et al. ................. | 439/62 |
| 4,995,825 A | * | 2/1991 | Korsunsky et al. ........... | 439/328 |
| 5,169,333 A | * | 12/1992 | Yang Lee ..................... | 439/326 |
| 5,232,400 A | * | 8/1993 | Chang et al. ................. | 439/326 |
| 5,244,403 A | * | 9/1993 | Smith et al. .................. | 439/326 |
| 5,286,217 A | * | 2/1994 | Liu et al. ..................... | 439/326 |
| 5,395,262 A | * | 3/1995 | Lwee ........................... | 439/326 |
| 5,413,496 A | * | 5/1995 | Yu ............................... | 439/326 |
| 6,409,518 B1 | * | 6/2002 | Hung ........................... | 439/61 |
| 7,147,476 B1 | * | 12/2006 | Chang et al. .................. | 439/62 |
| 2008/0298888 A1 | * | 12/2008 | Morita ......................... | 403/403 |
| 2009/0075494 A1 | * | 3/2009 | Crighton ...................... | 439/62 |

FOREIGN PATENT DOCUMENTS

| | | |
|---|---|---|
| JP | 57-119593 | 7/1982 |
| JP | 62-25775-UM | 2/1987 |
| JP | 4-72690-UM | 6/1992 |
| JP | 10-126071 | 5/1998 |
| JP | 10-154886 | 6/1998 |
| JP | 2007-067480 | 3/2007 |

* cited by examiner

*Primary Examiner*—James Harvey
(74) *Attorney, Agent, or Firm*—Morgan Lewis & Bockius LLP

(57) ABSTRACT

In fixing a standing board to a main board, the standing board is held by a first and a second fixing holder and fixed at right angles to the main board. The first and the second fixing holders are identical, being formed of metal plates having the same shape. The first fixing holder holds one of two opposite edges of the standing board with a side board thereof extending from an edge of a back board face in a direction perpendicular thereto such that the back board face and one face of the standing board face each other and are substantially parallel to each other. The second fixing holder holds the other one of the two opposite edges of the standing board with a side board thereof extending from an edge of a back board face in a direction perpendicular thereto such that the back board face and the other face of the standing board face each other and are substantially parallel to each other.

4 Claims, 8 Drawing Sheets

STANDING BOARD FIXING STRUCTURE AND TELEVISION RECEIVING APPARATUS

This application is based on Japanese Patent Application No. 2007-104379 filed on Apr. 12, 2007, the contents of which are hereby incorporated by reference.

BACKGROUND OF THE INVENTION

1. Field of the Invention

The present invention relates to a standing board fixing structure for fixing a standing board at right angles to a main board, and in particular relates to a standing board fixing structure for fixing a standing board to a main board by use of a fixing holder.

2. Description of Related Art

A description will be given of an example of conventional standing board fixing structure with reference to an accompanying drawing. FIG. 8 is a diagram showing a conventional method for fixing a standing board. As shown in FIG. 8, a standing board 1 is held at its two opposite edges by a fixing holder 2 that is formed of a single metal plate, and is disposed on a main board 3 at right angles thereto. In the state as shown in the figure, to electrically connect the standing board 1 to the main board 3, they are soldered to each other at a face of the main board 3 that is opposite to a face thereof on which the standing board 1 is disposed.

With the conventional fixing holder 2, which is built as a single metal plate member (a member integrally formed of a metal plate) for holding two opposite edges of the standing board 1, a back board face of the fixing holder 2, the back board face facing and being substantially parallel to the standing board 1, needs to be as long as or longer than the standing board 1. This increases the size of the fixing holder 2 and thus the amount of metal plate used therein, inviting an increase in cost.

JP-U-H04-72690, JP-U-S62-25775, and JP-A-H10-154886 disclose standing board fixing structures in which a pair of fixing holders each having a slit-shaped groove are fixed to a main board such that the grooves face each other and are substantially parallel to each other and two opposite edges of a standing board are engaged in the grooves, and thereby the standing board is supported. The fixing holders in these fixing structures are formed of resin, and thus do not suffer from the above-described disadvantages, which are peculiar to the above-described metal-plate fixing holder.

SUMMARY OF THE INVENTION

The present invention has been made in terms of the problems described above, and an object of the present invention is to provide a standing board fixing structure in which a fixing holder is made compact to reduce the amount of metal plate used therein to thereby achieve a cost reduction, and an LCD television receiving apparatus.

To achieve the above object, according to one aspect of the present invention, in a standing board fixing structure for fixing a standing board at right angles to a main board by use of a fixing holder, the fixing holder is composed of a first and a second fixing holder that are formed of metal plates having a same shape, the first fixing holder holds one of two opposite edges of the standing board with a side board thereof, the side board being formed to extend from an edge of a back board face of the first fixing holder in a direction perpendicular to the back board face, such that the back board face and one face of the standing board face each other and are substantially parallel to each other, and the second fixing holder holds an other one of the two opposite edges of the standing board with a side board thereof, the side board being formed to extend from an edge of a back board face of the second fixing holder in a direction perpendicular to the back board face, such that the back board face and an other face of the standing board face each other and are substantially parallel to each other.

According to the present invention, it is preferable that, in the standing board fixing structure described above, the first and the second fixing holders be each structured such that leg portions formed at bottoms of the back board face and the side board are inserted into holes formed in the main board to be soldered thereto, and the holes formed in the main board be positioned symmetrically about a middle point of a straight elongated area on which the standing board is disposed.

According to the present invention, it is preferable that, in the standing board fixing structure described above, the leg portions each have a claw projecting outward therefrom.

According to another aspect of the present invention, in a television receiving apparatus in which a digital board is fixed at right angles to an analog board with a fixing holder formed of a metal plate, the digital board performing signal processing of a video signal received by a tuner, the fixing holder is composed of a first and a second fixing holder that are formed of metal plates having a same shape, the first holder holds one of two opposite edges of the digital board with a side board thereof, the side board being formed to extend from an edge of a back board face of the first fixing holder in a direction perpendicular to the back board face, such that the back board face and one face of the digital board face each other and are substantially parallel to each other, the second fixing holder holds an other one of the two opposite edges of the digital board with a side board thereof, the side board being formed to extend from an edge of a back board face of the second fixing holder in a direction perpendicular to the back board face, such that the back board face and an other face of the digital board face each other and are substantially parallel to each other, the first and the second fixing holders are each structured such that leg portions formed at bottoms of the back board and the side board are inserted into holes formed in the analog board to be soldered thereto, and the holes formed in the analog board are positioned symmetrically about a middle point of a straight elongated area on which the standing board is disposed.

DETAILED DESCRIPTION OF PREFERRED EMBODIMENTS

Figure 1:
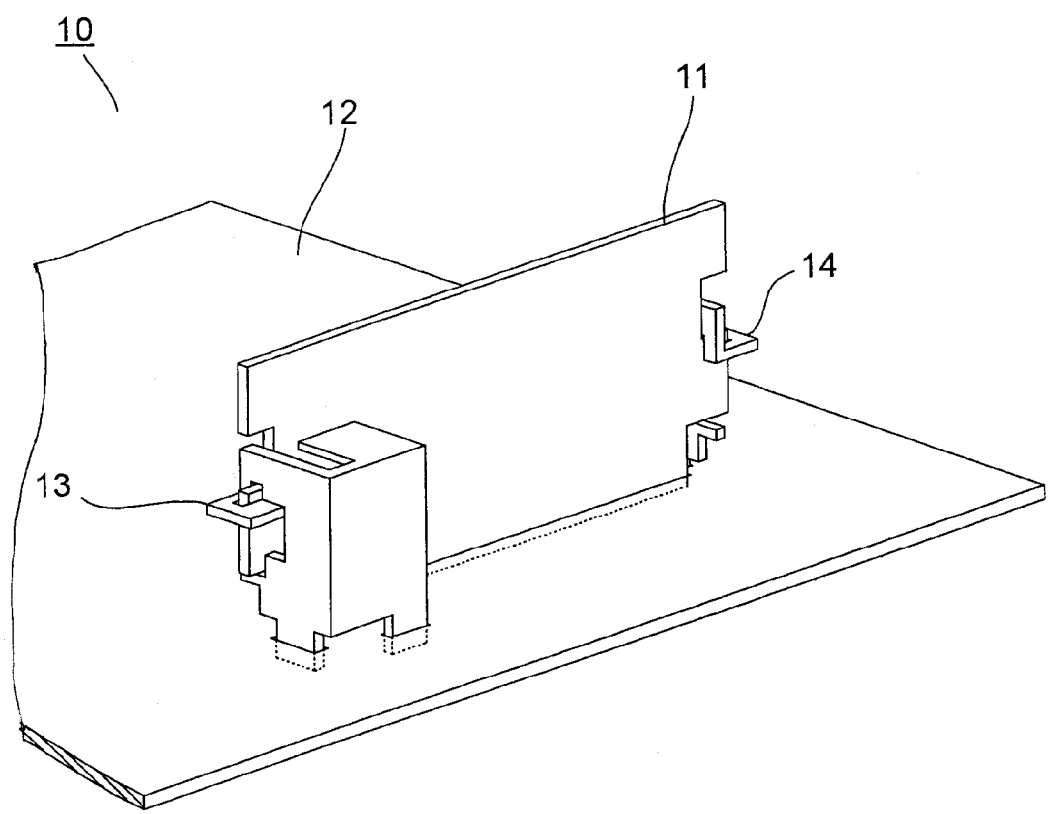
FIG. 1 is a diagram showing a standing board fixing structure of the present invention.

A description will now be given of preferred embodiments of the present invention with reference to the accompanying drawings. FIG. 1 is a diagram showing a standing board fixing structure 10 of the present invention. As shown in the figure, the standing board fixing structure 10 is designed for fixing a standing board 11 at right angles to a main board 12. To achieve this, the standing board fixing structure 10 of the present invention fixes the standing board to the main board 12 by use of first and second fixing holders 13 and 14. Specifically, first, the standing board 11 is engaged to the first and the second fixing holders 13 and 14, and then leg portions of the standing board 11 and the first and the second fixing holders 13 and 14 are each inserted into corresponding one of holes 12*a* to 12*e* formed in the main board 12 (see FIG. 5), and thus the standing board 11 is disposed on the main board 12 at right angles thereto. Then, the standing board 11 and the first and the second fixing holders 13 and 14 are fixed to the main board 12 by being soldered at the back face of the main board 12, on which the standing board 11 is not disposed.

Here, the first and the second fixing holders 13 and 14 need to fix the standing board 11 substantially at right angles to the main board 12. Furthermore, it is preferable that the standing board 11 can be easily engaged to the first and the second fixing holders 13 and 14 when it is fixed thereto. To achieve this, the standing board 11, the main board 12, and the first and the second fixing holders 13 and 14 are structured as described below to enhance the strength of the standing board 11 and the ease with which the standing board 11 is engaged to the first and the second fixing holders 13 and 14.

Figure 2:
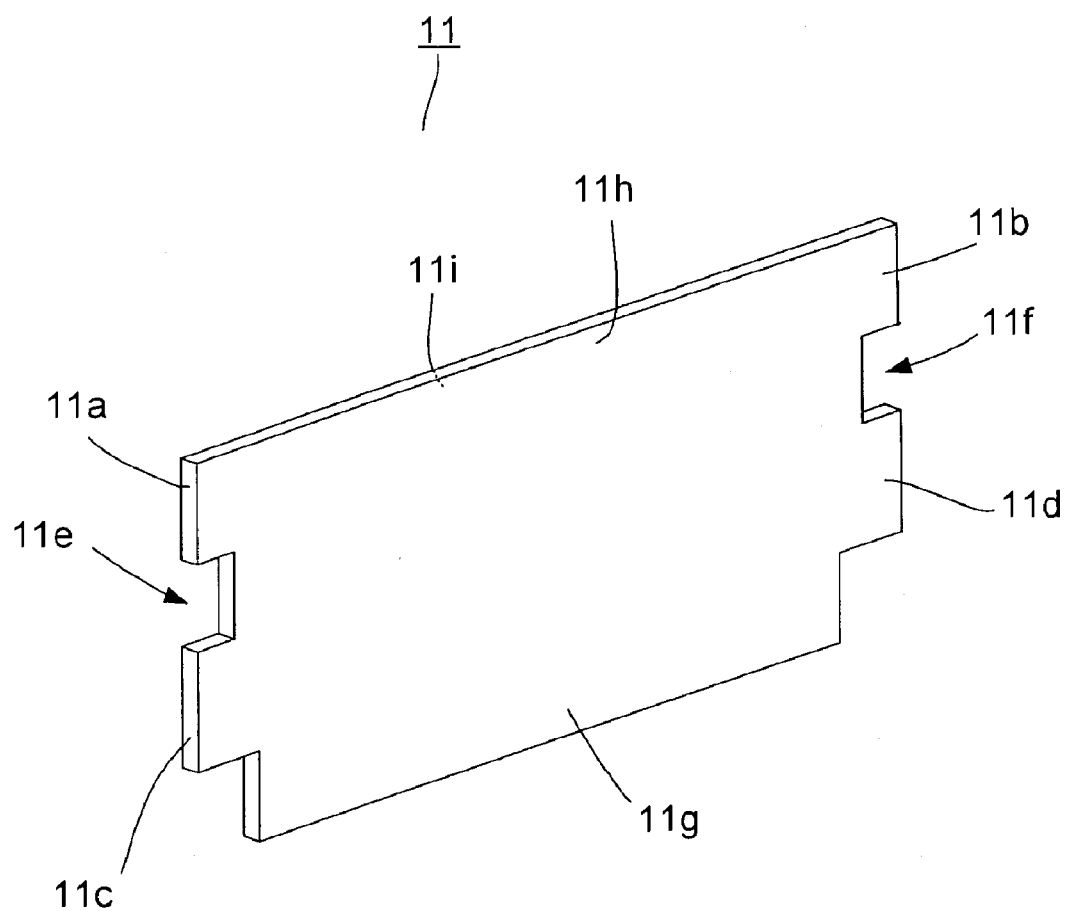
FIG. 2 is a perspective view showing the standing board fixing structure of the present invention.

FIG. 2 is a perspective view showing the structure of a standing board of the present invention. As shown in the figure, the standing board 11 is substantially rectangular in shape and is structured such that, in the middle of one and the other one of two opposite edges thereof, gaps 11*e* and 11*f* are formed between upper angular portions 11*a* and 11*b* and lower angular portions 11*c* and 11*d*, respectively, the upper angular portions 11*a* and 11*b* and the lower angular portions 11*c* and 11*d* being formed to have the same thickness. Furthermore, the standing board 11 has a leg portion 11*g* formed at its bottom to be inserted into the hole 12*a* of the main board 12. At the leg portion 11*g*, the standing board 11 is inserted into the hole 12*a* of the main board 12 and is soldered to the main board 12, and thereby the standing board 11 is electrically connected to the main board 12. The locations at which the gaps 11*e* and 11*f* are formed can be changed according to the shape of the fixing holders 13 that will be described later. The standing board 11 has a circuit formed by printing on its one face 11*h* (the face thereof illustrated as facing the front in FIG. 2). The reference numeral 11*i* denotes a face (the other face) of the standing board 11 that is opposite to the face 11*h*.

Figure 3:
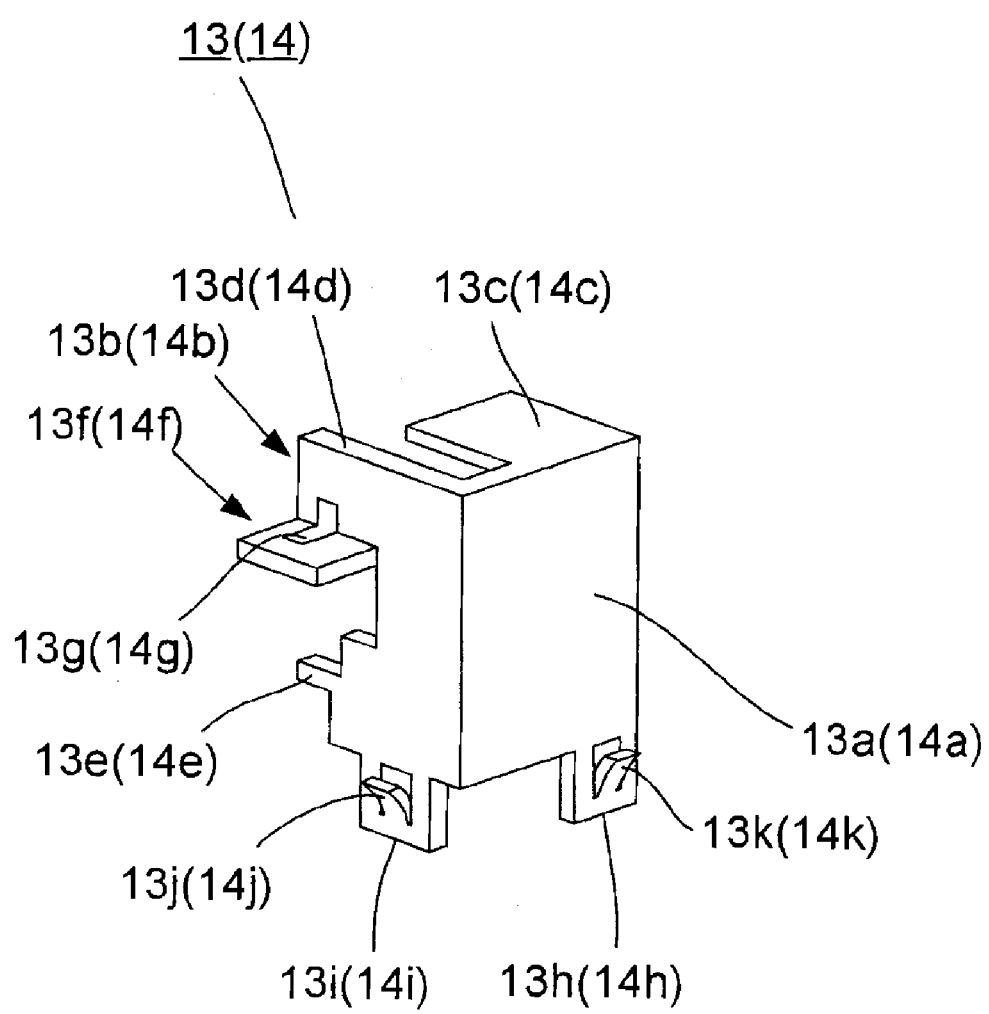
FIG. 3 is a perspective view showing the structure of a fixing holder.

The first and the second fixing holders 13 and 14 fix the standing board 11 substantially at right angles to the main board 12 and enhance the strength of the standing board 11 after it is fixed to the main board 12. FIG. 3 is a perspective view showing the structure of the first and the second fixing holders 13 and 14. In the figure, the reference numerals in parentheses are for the second fixing holder 14. As shown in FIG. 3, the first fixing holder 13 holds one of two opposite edges of the standing board 11 with a side board 13*b*, the side board 13*b* being formed to extend from an edge of a back board face 13*a* in a direction perpendicular to the back board face 13*a*, such that the back board face 13*a* and one face 11*h* of the standing board 11 face each other and are substantially parallel to each other. On the other hand, the second fixing holder 14 holds the other one of the two opposite edges of the standing board 11 with a side board 14*b*, the side board 14*b* being formed to extend from an edge of a back board face 14*a* in a direction perpendicular to the back board face 14*a*, such that the back board face 14*a* and the other face 11*i* of the standing board 11 face each other and are substantially parallel to each other. In this embodiment of the present invention, the heights of the back board faces 13*a* and 14*a* and the side board faces 13*b* and 14*b* constituting the first and the second fixing holders 13 and 14 are determined such that the back board faces 13*a* and 14*a* and the side boards 13*b* and 14*b* do not stand taller than the standing board 11 when it is fixed to the main board 12.

The first and the second fixing holders 13 and 14 are members that are formed of metal plates having the same shape. The first and the second fixing holders 13 and 14 are not formed to have a mirror image relation with respect to each other, but they are formed to have the same shape. Therefore, the following description will focus in detail on the shape of the first fixing holder 13, and a description will be omitted of the second fixing holder 14, which has the same shape as the first fixing holder 13.

The shape of the first fixing holder 13 embodying the present invention will be described below. As shown in FIG. 3, the first fixing holder 13 has a roof 13*c* formed by bending the upper portion of the back board face 13*a* toward the side where the side board 13*b* is formed, and also has a first and a second projection 13*d* and 13*e* both projecting from an edge of the side board 13*b*, the edge being opposite from the edge of the back board face 13*a* from which the side board 13*b* extends. Furthermore, the first projection 13*d* has a fixing member 13*f* into which the lower angular portion 11*c* of the standing board 11 is inserted to be held therein. The fixing member 13*f* is formed by forming in the first projection 13*d* a slot into which the lower angular portion 11*c* of the standing board 11 can be inserted and then bending the first projection 13*d* outward at the middle of the slot, as a result of which an L-shaped slot 13*g* is formed.

The back board face 11*a* and the side board 13*b* have leg portions 13*h* and 13*i* formed at their bottoms to be inserted into the holes 12*b* and 12*c* of the main board 12, respectively, to be fixed to the main board 12 with solder. The leg portions 13*h* and 13*i* have claws 13*j* and 13*k*, respectively, which are formed to project outward. The claws 13*j* and 13*k* are formed, for example, by making reverse-U-shaped cuts in the middle of the leg portions 13*h* and 13*i*, respectively, and raising the portions surrounded by the U-shaped cuts. This, however, is not meant to limit the method of forming the claws 13*j* and 13*k* described above, but they may be formed in any method as long as they are formed to project outward from the leg portions 13*h* and 13*i* and they engage with the holes 12*b* and 12*c* when the leg portions 13*h* and 13*i* are inserted into the holes 12*b* and 12*c*, respectively.

Figure 5:
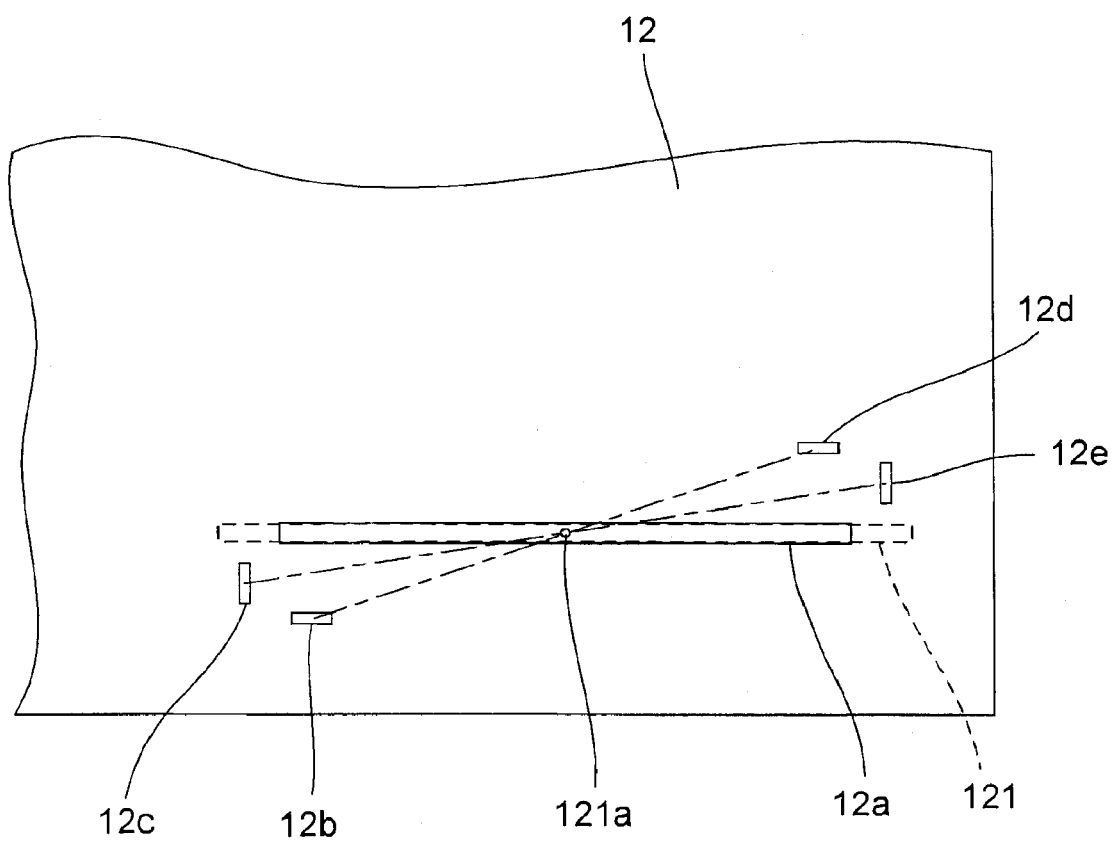
FIG. 5 is a plan view showing a main board.
Figure 6:
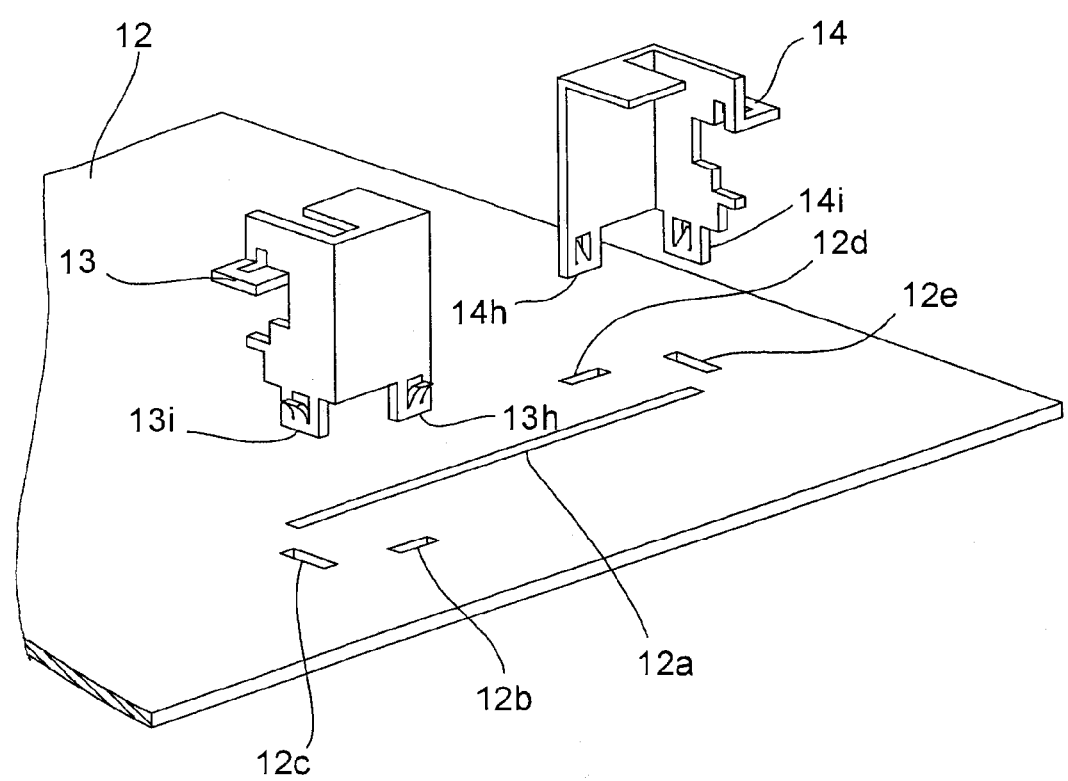
FIG. 6 is an exploded perspective view showing a first and a second fixing holder fixed to the main board.

FIG. 5 is a plan view showing the main board 12 of the present invention. FIG. 6 is an exploded perspective view showing the first and the second fixing holders fixed to the main board 12. As shown in FIGS. 5 and 6, in the main board 12, the straight elongated hole 12*a* is formed, into which the leg portion 11*g* of the standing board 11 is to be inserted; near the both ends of the hole 12*a*, the holes 12*b*, 12*c*, 12*d*, and 12*e* are formed into which the leg portions 13*h*, 13*i*, 14*h*, and 14*i* of the first and the second fixing holders are inserted, respectively. As shown in FIG. 5, the holes 12*b* and 12*d* are positioned symmetrically to the holes 12*c* and 12*e*, respectively, about a middle point 121a of a straight elongated area 121 (the area surrounded by the broken line in FIG. 5) on which the standing board 11 is disposed. Thus, simply by positioning the holes appropriately in the main board, it is possible to use two identical components as the first and the second fixing holders 13 and 14.

Figure 4:
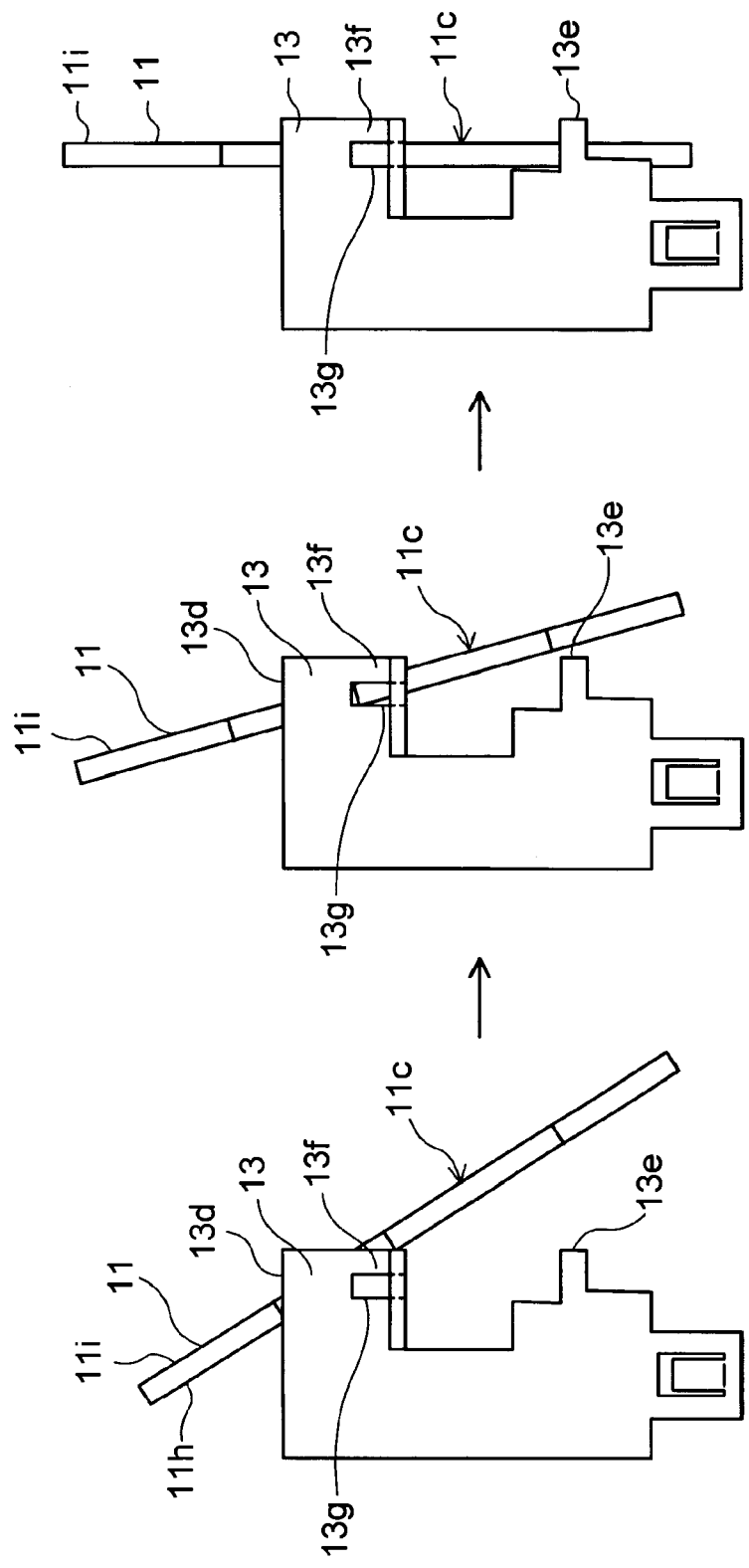
FIG. 4 is a diagram showing how the standing board is fixed to the fixing holder as seen from a side of the standing board.

Next, a description will be given of the standing board 11 and how the standing board 11 is fixed to the main board 12 by use of the first fixing holder 13. FIG. 4 is a diagram showing how the standing board 11 is fixed to the fixing holder 13 as seen from a side of the standing board 11. First, as shown in the left diagram of FIG. 4, the upper edge of the lower angular portion 11c of the standing board 11 is inserted, from between the first and the second projections 13d and 13e of the first fixing holder 13, into the L-shaped slot 13g of the fixing member 13f from below such that the face 11h of the standing board 11 and the back board face 13a of the first fixing holder 13 face each other and are substantially parallel to each other. Next, as seen in the middle diagram in FIG. 4, with the lower angular portion 11c inserted into the L-shaped slot 13g, the lower angular portion 11c is inserted into a gap formed between the first and the second projections 13d and 13e of the first fixing holder 13 such that the lower edge of the lower angular portion 11c of the standing board 11 comes not below the upper edge of the second projection 13e. In this state, an edge of the roof 13c covers the gap between the back board face 13a and the standing board 11 from above.

Likewise, first, the upper edge of the lower angular portion 11d of the standing board 11 is inserted, from between the first and the second projections 14d and 14e of the second fixing holder 14, into the L-shaped slot 14g of the fixing member 14f from below such that the face 11i of the standing board 11 and the back board face 14a of the second fixing holder 14 face each other and are substantially parallel to each other. Then, with the lower angular portion 11d inserted into the L-shaped slot 14g, the lower angular portion 11d is inserted into a gap formed by the first and the second projections 14d and 14e of the second fixing holder 14 such that the lower edge of the lower angular portion 11d of the standing board 11 comes not below the upper edge of the second projection 14e. In this state, the edge of the roof 14c covers the gap between the back board face 14a and the standing board 11 from above.

With the structure described above, as shown in the right diagram of FIG. 4, since the lower angular portions 11c and 11d are inserted into the first and the second fixing members 13f and 14f of the first and the second fixing holders 13 and 14, respectively, the standing board 11 is prevented from moving in the direction perpendicular to its faces 11h and 11i; and also, since the lower edges of the lower angular portions 11c and 11d of the standing board 11 comes in contact with the upper edges of the second projections 13e and 14e, respectively, the standing board 11 is supported from below. Thus, the standing board 11 is held by the first and the second fixing holders 13 and 14, being prevented from moving in the directions perpendicular and parallel to its faces 11h and 11i.

As described above, with the standing board 11 fixed to the first and the second fixing holders 13 and 14, the leg portion 11g of the standing board 11, the leg portions 13h and 13i of the first fixing holder 13, and the leg portions 14h and 14i of the second fixing holder 14 are each inserted into the corresponding one of the holes 12a to 12e in the main board 12. In this state, the main board 12 holding the standing board 11 and the first and the second fixing holders 13 and 14 thereon is soldered with the face thereof on which the standing board 11 is not disposed facing downward. In this way, solder attaches to the face of the main board 12 that faces downward to solder the standing board 11 and the first and the second fixing holders 13 and 14 to the main board 12, and thereby the standing board 11 is fixed substantially at right angles to the main board 12.

Figure 7:
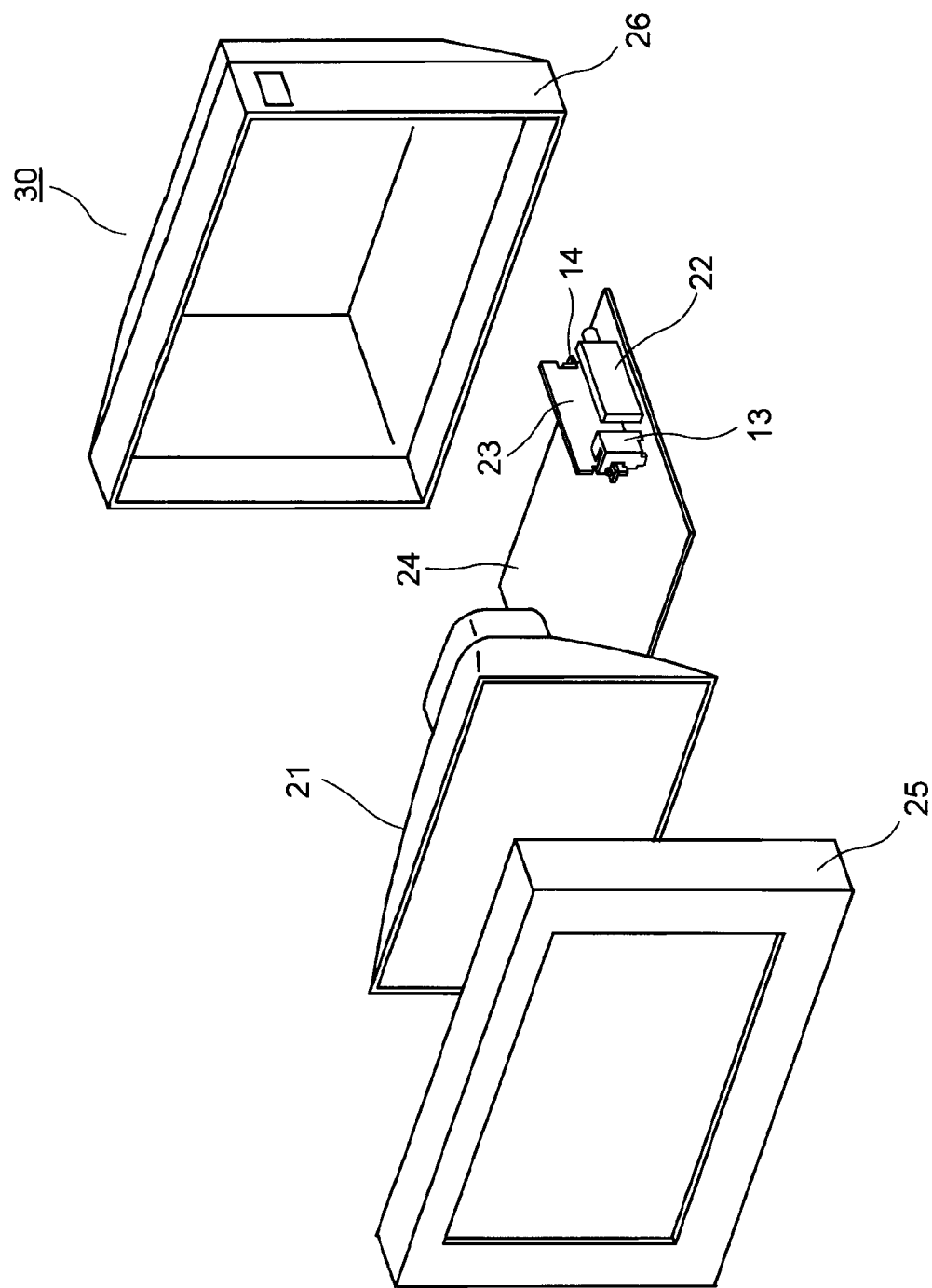
FIG. 7 is a diagram showing the structure of a television receiving apparatus using the standing board fixing structure of the present invention.
Figure 8:
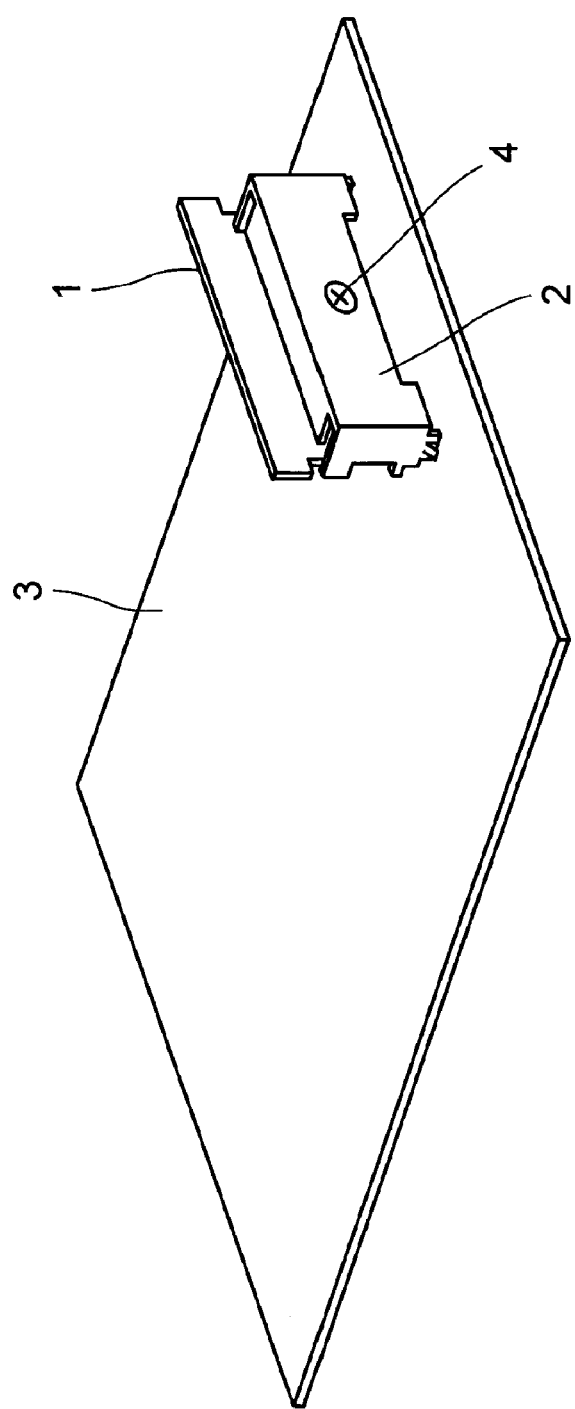
FIG. 8 is a diagram showing how a standing board is conventionally fixed.

Now, a description will be given of an embodiment in which the above-described standing board fixing structure 10 is used. FIG. 7 is a diagram showing the structure of a television receiving apparatus 30 using the standing board fixing structure 10 of the present invention. As shown in the figure, the television receiving apparatus 30 has: a display unit 21 displaying an image; a tuner 22 extracting a video signal having an intermediate frequency corresponding to a desired channel from a radio-frequency television broadcast signal received by an unillustrated antenna; a digital board 23 performing signal processing of the video signal extracted by the tuner 22; an analog board 24 generating a drive signal for displaying an image on the above-described display unit according to AC power from a commercial power source and a video signal from the digital board 23; and cabinets 25 and 26 housing the components described above.

With the structure described above, at the digital board, a signal for outputting an image and sound is generated according to a video signal extracted by the tuner 22. Then, according to the generated signal and power fed from the commercial power source, a drive signal for displaying an image on the display unit 21 is generated at the analog board 24 to be fed to the display unit 21, which then displays an image according to the fed drive signal. In the television receiving apparatus 30 of this embodiment, the display unit 21 is a CRT display unit. This, however, is not meant to be a limitation, but the display unit 30 may be a liquid crystal display unit or a plasma display unit.

In the television receiving apparatus 30 of this embodiment, the digital board 23 and the analog board 24 correspond to the standing board 11 and the main board 12 of the present invention, respectively. Thus, the digital board 23 is fixed at right angles to the analog board 24 with the first and the second fixing holders 13 and 14. Incidentally, with the television receiving apparatus 30 of this embodiment, since the standing board fixing structure 10 of the present invention is used therein, the digital board 23 can be improved in resistance to a shock from falling or to vibration, and furthermore, the fabrication of the television receiving apparatus 30 can be facilitated.

As described above, in the standing board fixing structure 10 of the present invention, the standing board 11 is held by the first and the second fixing holders 13 and 14 and is fixed at right angles to the main board 12. Here, the lower angular portions 11c and 11d of the standing board 11 are inserted into the fixing members 13f and 14f formed in the side boards of the first and the second fixing holders 13 and 14, respectively. That is, instead of holding two opposite edges of the standing board 11 with a single fixing holder as in the conventional example, the two opposite edges of the standing board 11 are separately held by two fixing holders (i.e., the first and the second fixing holders). This makes it possible to make the back board face of the fixing holder shorter than that of the conventional example, and thereby to make the fixing holder compact. As a result, the amount of metal plate used in the fixing holder can be reduced, and thus a cost reduction can be achieved. Furthermore, since two identical members that have the same shape and that are not in a mirror image relation with respect to each other can be used as the first and the second fixing holders 13 and 14, cost required for parts management can be reduced.

Needless to say, the present invention is not limited to the above-described embodiments. Those skilled in the art will naturally understand that the following are disclosed as an embodiment of the present invention: the combination of mutually replaceable members, structures, etc. disclosed in the above embodiments may be changed and applied as appropriate; the combination of members, structures, etc. that are not disclosed in the above embodiments but are known arts and replaceable with members, structures, etc. disclosed in the above embodiments may be replaced or changed and applied as appropriate; and the combination of members, combinations, etc. that are not disclosed in the above embodiments but are conceivable as substitutes by those skilled in the art based on known arts for members, structures, etc. disclosed in the embodiments may be replaced or changed and applied as appropriate.

What is claimed is:

1. A standing board fixing structure for fixing a standing board at right angles to a main board by use of a fixing holder, wherein
   the fixing holder is composed of a first and a second fixing holder that are formed of metal plates having a same shape,
   the first fixing holder holds one of two opposite edges of the standing board with a side board thereof, the side board being formed to extend from an edge of a back board face of the first fixing holder in a direction perpendicular to the back board face, such that the back board face and one face of the standing board face each other and are substantially parallel to each other, and
   the second fixing holder holds an other one of the two opposite edges of the standing board with a side board thereof, the side board being formed to extend from an edge of a back board face of the second fixing holder in a direction perpendicular to the back board face, such that the back board face and an other face of the standing board face each other and are substantially parallel to each other.

2. The standing board fixing structure of claim 1, wherein
   the first and the second fixing holders are each structured such that leg portions formed at bottoms of the back board face and the side board are inserted into holes formed in the main board to be soldered to the main board, and
   the holes formed in the main board are positioned symmetrically about a middle point of a straight elongated area on which the standing board is disposed.

3. The standing board fixing structure of claim 2, wherein
   the leg portions each have a claw projecting outward therefrom.

4. A television receiving apparatus in which a digital board is fixed at right angles to an analog board with a fixing holder formed of a metal plate, the digital board performing signal processing of a video signal received by a tuner,
   wherein
   the fixing holder is composed of a first and a second fixing holder that are formed of metal plates having a same shape,
   the first fixing holder holds one of two opposite edges of the digital board with a side board thereof, the side board being formed to extend from an edge of a back board face of the first fixing holder in a direction perpendicular to the back board face, such that the back board face and one face of the digital board face each other and are substantially parallel to each other,
   the second fixing holder holds an other one of the two opposite edges of the digital board with a side board thereof, the side board being formed to extend from an edge of a back board face of the second fixing holder in a direction perpendicular to the back board face, such that the back board face and an other face of the digital board face each other and are substantially parallel to each other,
   the first and the second fixing holders are each structured such that leg portions formed at bottoms of the back board face and the side board are inserted into holes formed in the analog board to be soldered to the analog board, and
   the holes formed in the analog board are positioned symmetrically about a middle point of a straight elongated area on which the standing board is disposed.

* * * * *